United States Patent [19]

Scott et al.

[11] Patent Number: 4,869,284

[45] Date of Patent: Sep. 26, 1989

[54] MANIFOLD ASSEMBLY

[75] Inventors: Darak M. Scott, Northamptonshire; Richard Davies, Milton Keynes, both of England

[73] Assignees: Plessey Overseas Limited, Ilford; Cryogenic and Vacuum Technology Limited, Keynes, both of England

[21] Appl. No.: 76,567
[22] PCT Filed: Oct. 29, 1986
[86] PCT No.: PCT/GB86/00668
§ 371 Date: Aug. 28, 1987
§ 102(e) Date: Aug. 28, 1987
[87] PCT Pub. No.: WO87/02750
PCT Pub. Date: May 7, 1987

[30] Foreign Application Priority Data

Oct. 29, 1985 [GB] United Kingdom ............... 8526566

[51] Int. Cl.⁴ .................. G05D 11/02; F16K 11/06
[52] U.S. Cl. .................................. 137/100; 137/594; 137/606
[58] Field of Search ............. 137/594, 595, 597, 606, 137/889, 599, 100, 110, 98

[56] References Cited

U.S. PATENT DOCUMENTS

| 681,690 | 9/1901 | Esterly | 137/595 |
| 945,143 | 1/1910 | Szamek | 137/889 X |
| 2,092,579 | 9/1937 | Kehl | 137/889 X |
| 3,324,872 | 6/1967 | Cloud | 137/98 |
| 3,628,566 | 12/1971 | Carse | 137/594 |
| 4,094,333 | 6/1978 | Petursson | 137/100 |
| 4,191,215 | 3/1980 | Gonner | 137/599 X |
| 4,193,835 | 3/1980 | Inoue | 156/606 |
| 4,257,438 | 3/1981 | Miller | 137/606 X |
| 4,533,410 | 8/1985 | Ogura et al. | 148/175 |

FOREIGN PATENT DOCUMENTS 8425137 2/1986 Fed. Rep. of Germany.
149724 9/1982 Japan.

OTHER PUBLICATIONS

IBM Technical Disclosure Bulletin, vol. 8, No. 7, Dec. 1965, p. 975, "Three-Way Valve with No Cross-Over Loss".

Primary Examiner—Stephen M. Hepperle
Attorney, Agent, or Firm—Fleit, Jacobson, Cohn, Price, Holman & Stern

[57] ABSTRACT

A gas handling manifold for use in metal-organic chemical vapor deposition systems, the manifold having a radial configuration with each vent/run valve equidistant from the center. Ensuring that gases switched simultaneously arrive in a reactor vessel substantially simultaneously, alleviating problems caused by intermediate reactions in the manifold. The manifold has minimal unflushed area (dead volumes) allowing incompatible materials to be handled in tandem.

11 Claims, 4 Drawing Sheets

MANIFOLD ASSEMBLY

The present invention relates to manifold assemblies and more particularly to manifolds to achieve mixing of fluids.

The mixing of fluids such as liquids or gases is required to be achieved with a high degree of accuracy in a wide variety of situations such as semi-conductor device fabrication and it is often necessary that reactive components must be mixed with an inert carrier to produce a solution or gaseous mixture of the required concentration before reaction.

Previously manifolds have had large dead-space or unflushed volumes causing problems with overshooting and other anomalies in composition. Also problems have been encountered in releasing reagents in the reactor simultaneously and in handling incompatible materials in tandem. A particular problem with linear manifolds is that reagents switched at the same time arrive in the reactor at different times causing compositional transients.

According to the present invention there is provided a manifold assembly comprising a manifold body first and second inlet ports, an outlet nozzle and a plurality of valves, the manifold body comprising at least two substantially isolated duct systems a first of which leads from the first inlet port to the outlet nozzle and a second of which leads from the second inlet port to the outlet nozzle, the inlet ports having respective substantially concentric channels leading to the respective duct systems and the outlet nozzle having substantially concentric tubes leading from the respective duct systems, the plurality of valves being arranged in sets, one set for each duct system, radially mounted about the manifold body with a reagent outlet of each valve connected to at least one duct of one of the duct systems wherein the duct lengths from each valve in the same valve set to the output nozzle are substantially the same and a carrier fluid flowing from the inlet ports through the duct systems will pick up any reagent released by a valve in the respective valve sets for delivery to the output nozzle.

Preferably, the isolated duct systems will be arranged to promote mixing of the carrier fluid and any added reagent. The duct systems may have sharp bends and constrictions accordingly.

Preferably, the rate of carrier fluid flow will be kept constant allowing accurate control of composition. The pressures of carrier fluids in respective duct systems may be balanced by a control system. Also the pressure of the carrier fluid about the valves may be regulated by a further control system.

Preferably, if the valves have an unflushed volume it will be as small as possible.

An embodiment of the present manifold assembly will now be described by way of example only with reference to the accompanying drawings in which.

Figure 1:
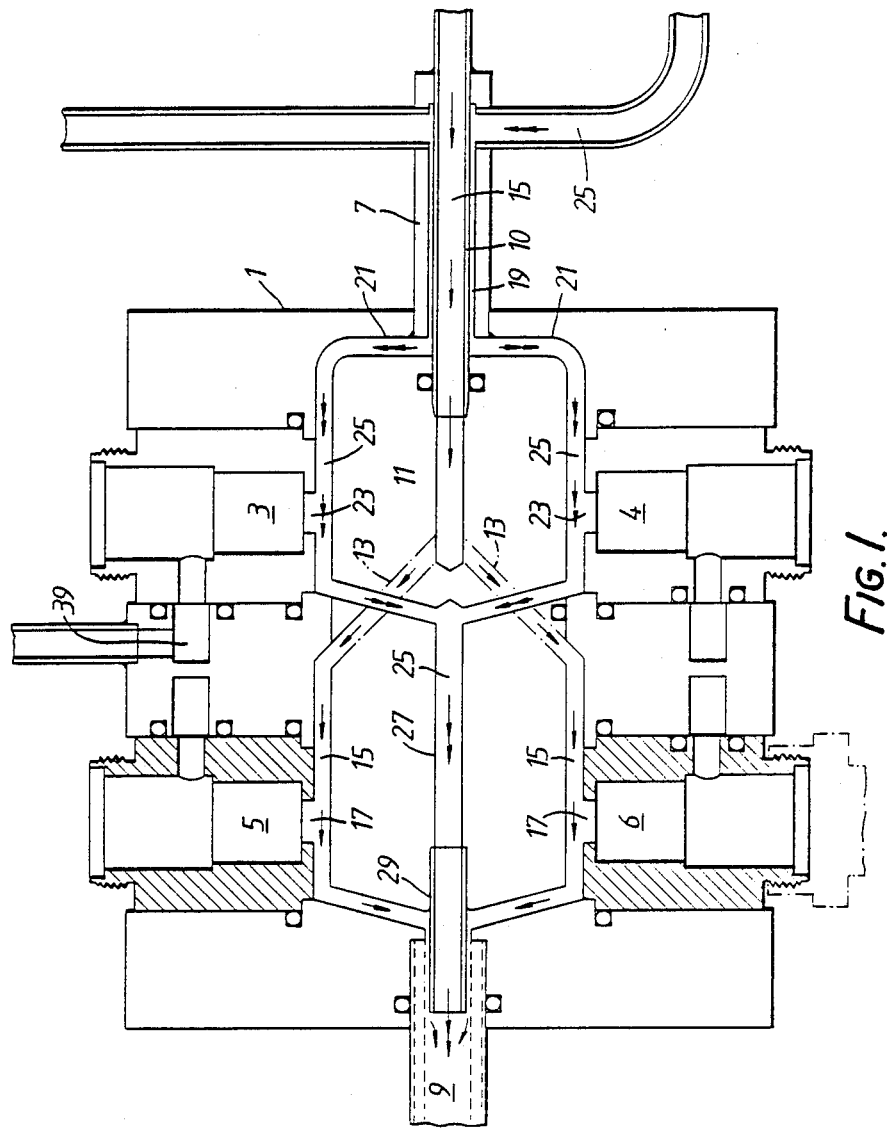
FIG. 1 shows a plan cross-section of a manifold assembly according to the present invention.

Referring to FIG. 1, a manifold body 1 has two independent duct systems (respectively indicated by single and double-headed arrows) connecting two separate valve sets (eg. 3 and 4, 5 and 6), a concentric input port 7 and a reaction vessel 9. The first duct system starts with a centre channel 10 of the concentric input port 7 and comprises a first central duct 11 leading to branch arms 13 distributing a portion of a carrier fluid flow 15 in the system to output ports 17 of each of a first valve set collecting any reagent released before outputing the carrier fluid and any reagent input from the valves to the reaction vessel 9. The second duct system begins with the outer channel 19 of the concentric input port 7 which leads to ducts 21 connected to output ports 23 of each valve 3 or 4 of a second valve set allowing a carrier fluid flow 25 in the second duct system to pick up reagents released by each valve 3 or 4 and take them to a second central duct 27 and thence to the reaction vessel 9. The first and second duct systems terminate just prior to the reaction vessel 9 in a concentric nozzle 29 which brings the two carrier fluid flows 15 and 25 into contact and promotes mixing.

Reagents introduced through the valves (3,4,5 and 6) are mixed in their respective carrier fluid flows by the action of currents and turbulence induced by duct constrictions, configurations and sharp bends. Thus, carrier fluid/reagent flows are quite homogeneous.

Figure 2:
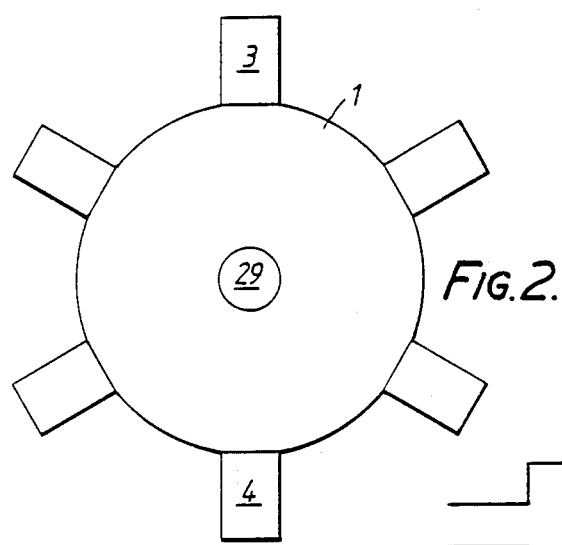
FIG. 2 shows an end view of the manifold shown in FIG. 1.

Valves in the manifold assembly 1 are radially mounted (see FIG. 2) so reagents injected at the same time in a particular valve set will arrive in the reaction vessel 9 simultaneously when carrier fluid flow rates are constant. Also, by considering duct lengths, reagents entering from different valve sets can be made to arrive substantially simultaneously at the reaction vessel 9.

Simultaneous arrival of reagents may be further enhanced by differing the diameter of the ducts between the two duct systems, for example, such that reagent from the valve 2 travels in ducts 23, 25 at a higher speed than reagent released from the valve 5 travels in the ducts 15 and 29.

It will be appreciated that as the duct systems are independent of one another, reagents which are mutually reactive can be accomodated and mixed to the correct composition or concentration in the same manifold assembly.

Figure 3:
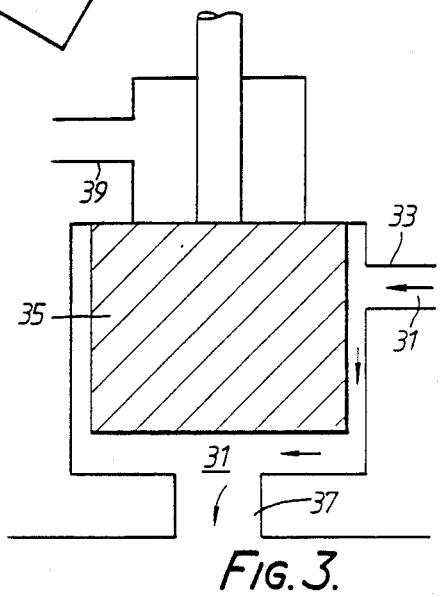
FIG. 3 illustrates a valve, which may be used in the manifold assembly shown in FIG. 1, in an open state.
Figure 4:
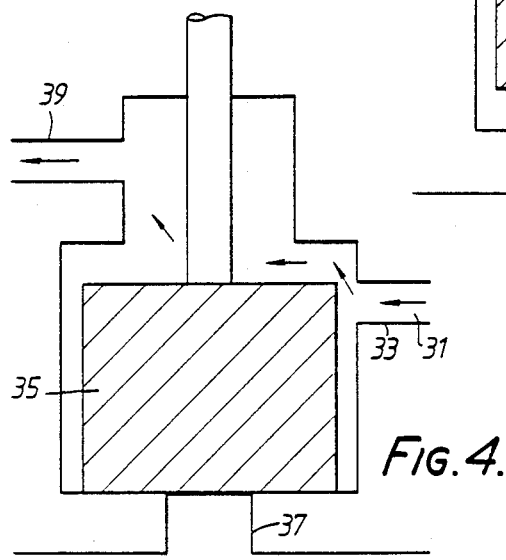
FIG. 4 shows the valve of FIG. 3 in a closed state.
Figure 5:
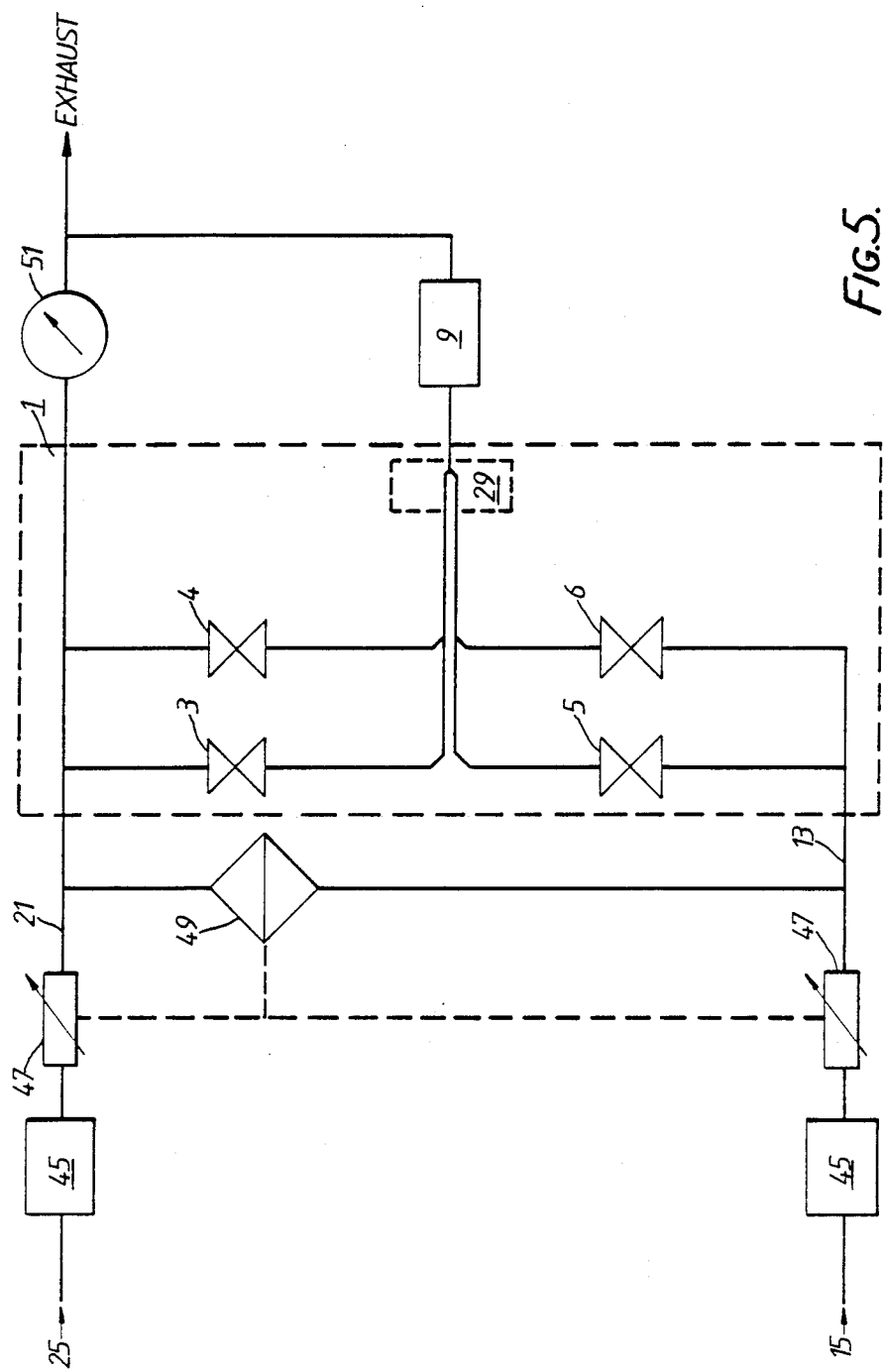
FIG. 5 shows a system to regulate carrier fluid pressures in the manifold of FIG. 1; and, FIG. 6 illustrates a system to regulate carrier fluid and valve vent pressures in the manifold of FIG. 1.

To achieve good control of reagent composition in the carrier fluid flows, valves used must have fast switching actions and small "dead volumes". A valve having these features is shown in FIGS. 3 and 4 in an open and in an closed state respectively. With the valve open (FIG. 3), a reagent flow 31 can pass through the valve via an input port 33 and past plunger 35 to an output port 37 corresponding to ports 17 and 23 of FIG. 1) while a vent 39 is sealed from the reagent flow 31. In the closed state (FIG. 4), the output port 37 is sealed by plunger 35 while the reagent flow 31 passes from the inlet port 33 to the vent 39 thence to the exhaust chamber 8 and port. The "dead" volume of the valve is thus limited to the volume of the output port 37. Obviously, if constant fluid flows are to be achieved, allowing accurate control of composition and concentration, the pressures of all carrier fluid flows and reagent flows must be equalised to avoid pressure surges when the valves are operated. Referring to FIG. 5 a system to regulate carrier fluid pressures is illustrated. Each flow 15 and 25 passes through a mean flow meter 45 and a control valve 47 before picking up reagents at valves 3 and 4 or 5 and 6 in the manifold assembly 1. Between ducts 13 and 21 a differential pressure transducer 49 is connected to compare the pressure in each duct. If a discrepancy is noted the differential pressure transducer 49 either opens or closes the control valve 47 thus equalising pressures between the ducts. A further valve 51, creates a pressure differential between the carrier fluid flow and fluid flow after reaction.

Figure 6:
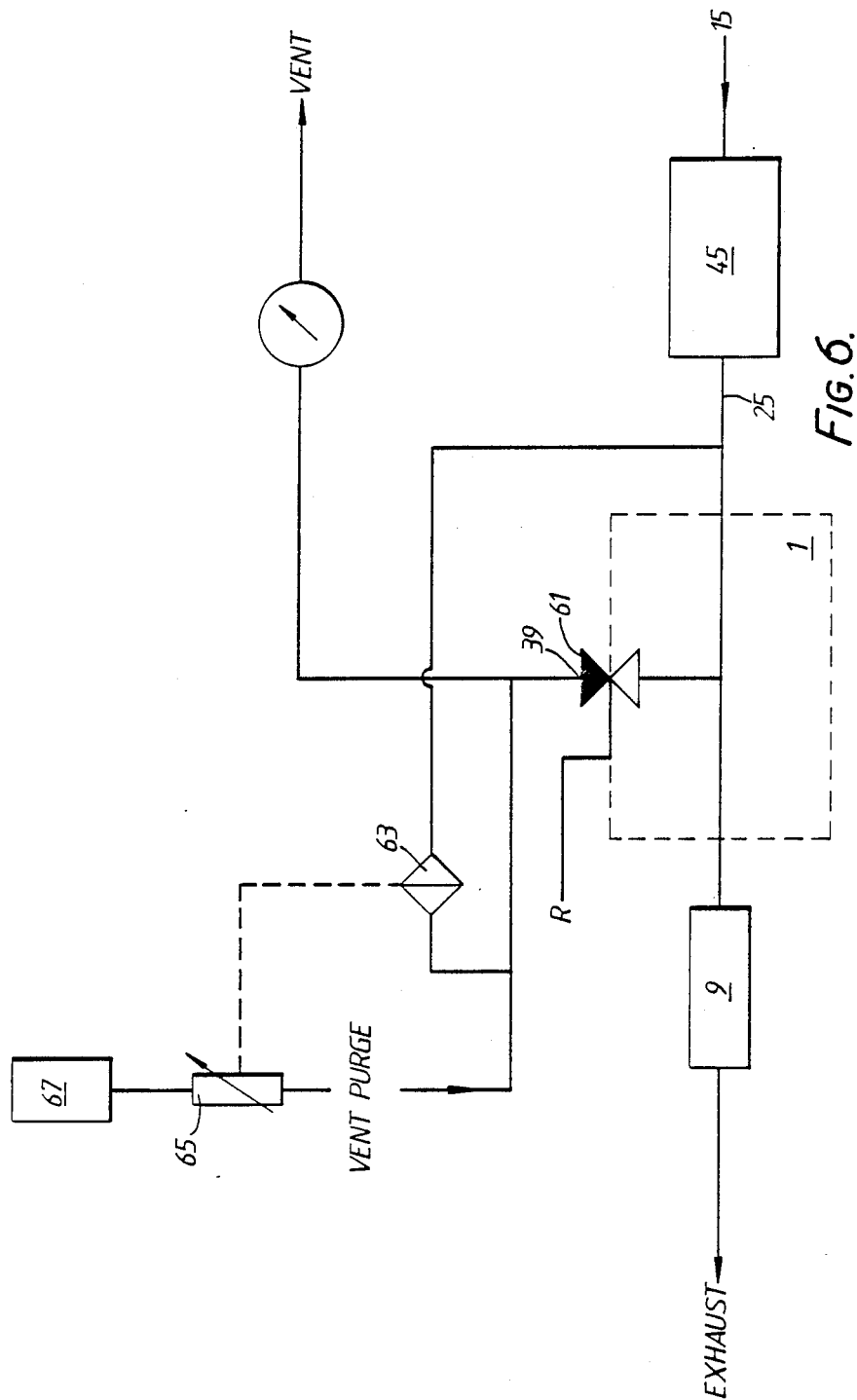

Consider FIG. 6, illustrating a system to regulate the pressures of the carrier fluid flow 15 and the inlet-vent flow 37 of a valve 61. The carrier fluid flow 15 passes through a mean flow meter 45 before entering the manifold 1 and subsequently the reactor vessel 9. A differential pressure transducer 63 is connected between the vent 39 and the duct 25 such that the pressure of fluids in each are compared. If a discrepancy is identified the transducer 63 either opens or closes a control valve 65 to a vent purge 67 normalizing the pressure between the vent 39 and duct 25.

For the avoidance of doubt it is here noted that in the manifold 1 of FIG. 1 all of the vents 39 (only one of which is visible) are coupled to an exhaust system by way of ducts (e.g.) 40. Thus reagent flow 31 through the valves 3,4,5,6 may be constant regardless of whether the inlet port 33 is connected to the output port 37 or the vent 39.

The carrier fluid used in the manifold assembly may be for example helium or hydrogen, and reagent may be taken from the group II or III metal alkyls and group V or VI hydrides.

I claim:

1. A manifold assembly comprising a manifold body, first and second inlet ports, an outlet nozzle and a plurality of valves, the manifold body comprising at least two substantially isolated duct systems a first of which leads from the first inlet port to the outlet nozzle and a second of which leads from the second inlet port to the outlet nozzle, the inlet ports having respective substantially concentric channels leading to the respective duct systems and the outlet nozzle having substantially concentric tubes leading from the respective duct systems, the plurality of valves being arranged in sets, one set for each duct system, the valves being radially mounted about the manifold body with a reagent outlet of each valve connected to at least one duct of one of the duct systems with duct lengths from each valve in the same valve set to the output nozzle being substantially the same whereby a carrier fluid flowing from the inlet ports and through the duct systems will pick up any reagent released by a valve in the respective valve sets for delivery to the output nozzle.

2. A manifold assembly as claimed in claim 1 wherein each isolated duct system includes means to promote mixing of a carrier fluid flowing therein with any added reagent.

3. A manifold assembly as claimed in claim 2 wherein the duct systems include bends to promote mixing.

4. A manifold assembly as claimed in claim 2 wherein the duct systems include constrictions to promote mixing.

5. A manifold assembly as claimed in claim 1 wherein rate of carrier fluid flow in each duct system is maintained substantially constant to promote accurate control of composition.

6. A manifold assembly as claimed in claim 1 further comprising a pressure control system arranged to balance carrier fluid pressures in the respective duct system.

7. A manifold assembly as claimed in claim 6 wherein the pressure control system also regulates the pressure of carrier fluid about the valves.

8. A manifold assembly as claimed in claim 6 wherein the pressure of carrier fluid about the valves is maintained by a further pressure control system.

9. A manifold assembly as claimed in claim 1 wherein the volume of duct unflushed by carrier fluid at connection areas of the valves is substantially negligible to minimise the quantity of unwanted reagent remaining in the duct systems after closure of one of the valves.

10. A manifold assembly as claimed in any preceding claim wherein the cross sectional dimensions of the ducts differ between the duct systems, the dimensions being selected substantially to equalise the time taken for reagent to travel from a valve in one set to the outlet nozzle and the time taken for reagent to travel from a valve in another set to the outlet nozzle.

11. A manifold assembly as claimed in any preceding claim in which each valve comprises an inlet port, an outlet port, an exhaust vent and a moveable member which has a first position at which reagent may flow from the inlet port to the outlet port and a second position at which reagent may flow from the inlet port to the exhaust vent.

* * * * *